(12) United States Patent
Rege et al.

(10) Patent No.: US 9,154,238 B2
(45) Date of Patent: Oct. 6, 2015

(54) METHODS AND APPARATUS FOR REDUCING INTERFERENCE EFFECT ON DATA TRANSMITTED OVER A COMMUNICATION CHANNEL

(71) Applicant: Alactel-Lucent USA Inc., Murray Hill, NJ (US)

(72) Inventors: Kiran M. Rege, Marlboro, NJ (US); Krishna Balachandran, Morganville, NJ (US); Joseph H. Kang, Belle Mead, NJ (US); Kemal M. Karakayali, Hoboken, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 13/853,630

(22) Filed: Mar. 29, 2013

(65) Prior Publication Data

US 2014/0294114 A1 Oct. 2, 2014

(51) Int. Cl.
*H04L 5/12* (2006.01)
*H04B 15/00* (2006.01)

(52) U.S. Cl.
CPC ...................................... *H04B 15/00* (2013.01)

(58) Field of Classification Search
None
See application file for complete search history.

(56) References Cited

U.S. PATENT DOCUMENTS

| 7,653,153 B2 | 1/2010 | Tosato et al. |
| 8,238,471 B2 | 8/2012 | Hwang et al. |
| 8,320,432 B1 | 11/2012 | Chockalingam et al. |
| 2002/0097703 A1 | 7/2002 | Nieczyporowicz et al. |
| 2004/0194004 A1 | 9/2004 | Betts |
| 2013/0170533 A1 | 7/2013 | Khojastepour et al. |

OTHER PUBLICATIONS

Erez, U. and ten Brink, S., "A Close-to-Capacity Dirty Paper Coding Scheme," *IEEE Transactions on Information Theory*, vol. 51, No. 10, 2005.
Gallager, R.G., *Low-Density Parity-Check Codes*, MIT Press, Cambridge, MA, 1963.
MacKay, D.J.C., and Neal, R.M., "Near Shannon Limit Performance of Low Density Parity Check Codes," *Electronic Letters*, vol. 32, pp. 1645-1646, Aug. 1996.
Costa, M.H.M., "Writing on Dirty Paper", IEEE Trans. on Information Theory, vol. 29, No. 3, May, 1983.
Forney, G.D., "Coset Codes—Part I: Introduction and Geometrical Classification", IEEE Trans. on Information Theory, vol. 34, No. 5, Sep. 1988.
Ungerboeck, G., "Trellis-Coded Modulation with Redundant Signal Sets Part I: Introduction", IEEE Communications Magazine, vol. 25, No. 2, Feb. 1987.
Office Action for corresponding U.S. Appl. No. 13/853,629 dated Sep. 10, 2014.

(Continued)

*Primary Examiner* — Adolf Dsouza
(74) *Attorney, Agent, or Firm* — Harness, Dickey & Pierce, P.L.C.

(57) ABSTRACT

In one example embodiment, a method for reducing an effect of an interference signal on data being transmitted over a communication channel is disclosed. The method includes determining, by a processor, a code vector representing data based on an information vector and an interference vector, the information vector representing the data, the interference vector representing the interference signal. The method further includes generating, by the processor, a transmit vector for transmitting the data based on the code vector and the interference vector.

20 Claims, 8 Drawing Sheets

(56) References Cited

OTHER PUBLICATIONS

Office Action for corresponding U.S. Appl. No. 14/026,581 dated Jan. 2, 2015.

Office Action for corresponding U.S. Appl. No. 13/853,629 dated Feb. 11, 2015.

Peel, "On Dirty-Paper Coding" Lecture Notes, IEEE Signal Processing Magazine, pp. 112-113 (May 2003).

METHODS AND APPARATUS FOR REDUCING INTERFERENCE EFFECT ON DATA TRANSMITTED OVER A COMMUNICATION CHANNEL

BACKGROUND

In a conventional communication system, when a signal carrying a certain number of information bits representing data is transmitted to over a communication channel, the signal is contaminated by channel noise and/or interference from another signal, which may be referred to as an interference signal. If the signal is to be successfully received at the receiving device in the presence of noise as well as the interference signal, the transmit signal has to be strong enough to overcome both the noise and the interference.

Conventional communication systems simply transmit the transmit signal at a power level that is high enough to overcome the noise as well as the interference signal. However, an increase of signal power may be wasteful. Another proposed solution is based on what is known as Dirty Paper Coding (DPC).

DPC provides, in theory, that if an interfering signal is known to the transmitter non-causally, it is possible to devise an encoding scheme that can deliver the transmit signal to the intended receiver as efficiently, in terms of the power required to achieve error-free delivery, as in the case where the interference signal does not exist. In other words, DPC provides that in a communication channel with a constraint on the transmit energy and in which the received signal is corrupted by channel noise as well as an interference signal non-causally known to the transmitter, it is possible to construct a coding scheme such that the error performance of the system would be similar to the error performance of the system in the absence of the interference signal.

SUMMARY

Some embodiments relate to methods and apparatuses for reducing the effect of an interference signal on data being transmitted over a communication channel. The reduction of the effect of the interference signal is achieved by constructing a coding scheme according to which an information vector representing the data is encoded with the interference signal known to an encoding device such that the encoded data is the closest representation of the interference signal. Thereafter, the interference signal is subtracted from the encoded data and the resulting vector, referred to as a transmit vector, is transmitted over the communication channel.

In one example embodiment, a method for reducing an effect of an interference signal on data being transmitted over a communication channel includes determining, by a processor, a code vector based on an information vector and an interference vector, the information vector representing the data, the interference vector representing the interference signal. The method further includes generating, by the processor, a transmit vector for transmitting the data based on the code vector and the interference vector.

In yet another example embodiment, the determining the code vector includes generating an auxiliary vector, combining the auxiliary vector with the information vector to obtain a combination vector, selecting a sequence of subsets of a signal constellation using a subset of entries of the combination vector, and mapping the remaining entries of the combination vector to signal points within the selected subsets of the signal constellation.

In yet another example embodiment, the combining the auxiliary vector with the information vector further includes assigning values of the generated auxiliary vector to entries of a temporary combination vector that correspond to a temporary auxiliary vector, the temporary combination vector including values corresponding to the information vector and the temporary auxiliary vector.

In yet another example embodiment, the mapping is carried out according to Gray Coding.

In yet another example embodiment, the assigning values to the entries of the temporary combination vector that correspond to the temporary auxiliary vector is carried out to minimize a distance between the code vector and the interference vector compared to distances between all possible code vectors associated with the information vector and the interference vector.

In yet another example embodiment, the selecting a sequence of subsets of a signal constellation selects the sequence according to a Trellis Coded Modulation (TCM) scheme.

In yet another example embodiment, the selecting a sequence of subsets of a signal constellation uses a constrained Trellis Coded Modulation (TCM) decoder.

In yet another example embodiment, the signal constellation is associated with at least one of a Pulse Amplitude Modulation (PAM) system and a Quadrature Amplitude Modulation (QAM) system.

In yet another example embodiment, the generating the transmit vector includes subtracting the interference vector from the code vector.

In yet another example embodiment, the method further includes communicating to a receiving device, a scheme according to which the code vector is determined, the scheme enabling the receiving device to estimate the information vector, wherein the scheme is communicated over a separate control channel, the control channel being different than the communication channel.

In one example embodiment, an encoding device includes a processor for reducing an effect of an interference signal on data transmitted over a communication channel. The processor is configured to determine a code vector based on an information vector and an interference vector, the information vector representing the data, the interference vector representing the interference signal. The processor is further configured to generate a transmit vector for transmitting the data based on the code vector and the interference vector.

In yet another example embodiment, the processor is further configured to determine the code vector by generating an auxiliary vector, combining the auxiliary vector with the information vector to obtain a combination vector, assigning values to entries of the combination vector that correspond to the auxiliary vector, selecting a sequence of subsets of a signal constellation using a subset of the entries of the combination vector to select a sequence of subsets of a signal constellation, and mapping the remaining entries of the combination vector to signal points within the selected subsets of the signal constellation.

In yet another example embodiment, the processor is further configured to combine the auxiliary vector with the information vector by assigning values of the generated auxiliary vector to entries of a temporary combination vector that correspond to a temporary auxiliary vector, the temporary combination vector including values corresponding to the information vector and the temporary auxiliary vector.

In yet another example embodiment, the processor is further configured to perform the mapping according to Gray Coding.

In yet another example embodiment, the processor assigns values to entries of the temporary combination vector that correspond to the temporary auxiliary vector so as to minimize the distance between the code vector and the interference vector compared to distances between all possible code vectors associated with the information vector and the interference vector.

In yet another example embodiment, the processor the processor is further configured to select the sequence of subsets of the signal constellation according to a Trellis Coded Modulation (TCM) scheme.

In yet another example embodiment, the processor is further configured to the processor is further configured to generate the transmit signal by subtracting the interference vector from the code vector.

In yet another example embodiment, the processor is further configured to communicate to a receiving device, a scheme according to which the code vector is determined, the scheme enabling the receiving device to estimate the information vector, wherein the scheme is communicated over a separate control channel, the control channel being different than the communication channel.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limiting of the present disclosure, and wherein.

DETAILED DESCRIPTION OF EXAMPLE EMBODIMENTS

Various embodiments will now be described more fully with reference to the accompanying drawings. Like elements on the drawings are labeled by like reference numerals.

Detailed illustrative embodiments are disclosed herein. However, specific structural and functional details disclosed herein are merely representative for purposes of describing example embodiments. This disclosure may, however, be embodied in many alternate forms and should not be construed as limited to only the embodiments set forth herein.

Accordingly, while example embodiments are capable of various modifications and alternative forms, the embodiments are shown by way of example in the drawings and will be described herein in detail. It should be understood, however, that there is no intent to limit example embodiments to the particular forms disclosed. On the contrary, example embodiments are to cover all modifications, equivalents, and alternatives falling within the scope of this disclosure. Like numbers refer to like elements throughout the description of the figures.

Although the terms first, second, etc. may be used herein to describe various elements, these elements should not be limited by these terms. These terms are only used to distinguish one element from another. For example, a first element could be tensed a second element, and similarly, a second element could be termed a first element, without departing from the scope of this disclosure. As used herein, the term "and/or," includes any and all combinations of one or more of the associated listed items.

When an element is referred to as being "connected," or "coupled," to another element, it can be directly connected or coupled to the other element or intervening elements may be present. By contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware at existing network elements. Such existing hardware may include one or more Central Processing Units (CPUs), digital signal processors (DSPs), application-specific-integrated-circuits, field programmable gate arrays (FPGAs), computers or the like.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium" or "computer readable storage medium" may represent one or more devices for storing data, including read only memory (ROM), random access memory (RAM), magnetic RAM, core memory, magnetic disk storage mediums, optical storage mediums, flash memory devices and/or other tangible machine readable mediums for storing information. The term "computer-readable medium" may include, but is not limited to, portable or fixed storage devices, optical storage devices, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware, or microcode, the program code or code segments to perform the necessary tasks may be stored in a machine or computer readable medium such as a computer readable storage medium. When implemented in software, a processor or processors will perform the necessary tasks.

A code segment may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory content. Information, arguments, parameters, data, etc. may be passed, forwarded, or transmitted via any suitable means including memory sharing, message passing, token passing, network transmission, etc.

Example embodiments may be utilized in conjunction with RANs such as: Universal Mobile Telecommunications System (UMTS); Global System for Mobile communications (GSM); Advance Mobile Phone Service (AMPS) system; the Narrowband AMPS system (NAMPS); the Total Access Communications System (TACS); the Personal Digital Cellular (PDC) system; the United States Digital Cellular (USDC) system; the code division multiple access (CDMA) system described in EIA/TIA IS-95; a High Rate Packet Data (HRPD) system, Worldwide Interoperability for Microwave Access (WiMAX); Ultra Mobile Broadband (UMB); and $3^{rd}$ Generation Partnership Project LTE (3GPP LTE).

While there have been attempts to construct encoding schemes to implement dirty paper coding, none have found practical applications, mainly because of the complexity associated with such methods. Another reason that implementation of DPC has not been successful is that efforts have been mainly directed towards construction schemes that are aimed at getting close to the promised channel capacity. As a result, these schemes have turned out to be too complex for practical implementation. Example embodiments described herein enable practical constructions of encoding schemes to implement DPC.

Figure 1:
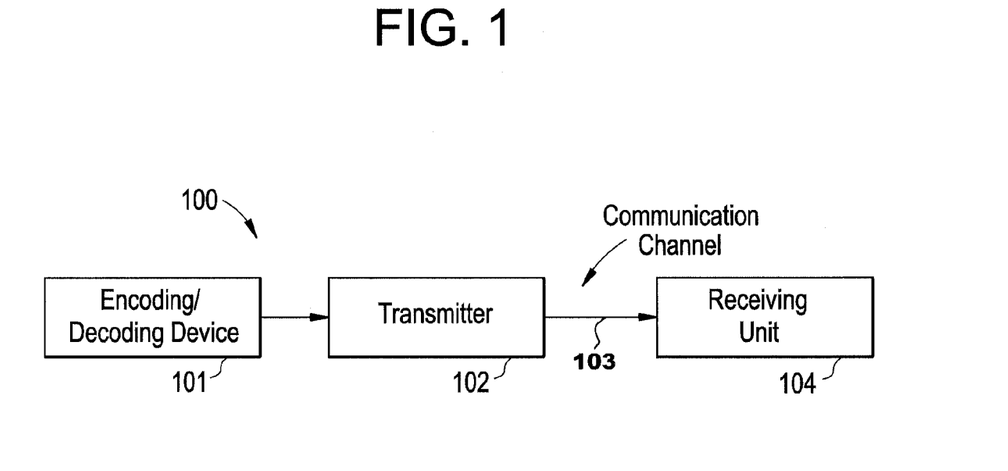
FIG. 1 depicts a communication system, in which an example embodiment for reducing interference signal effect is implemented.

FIG. 1 depicts a communication system, in which an example embodiment for reducing interference signal effect is implemented. The communication system 100 includes an encoding device 101, a transmitter 102, a communication channel 103 and a receiving device 104. The communication system 100 may be any type of a broadcast system in which a transmitting device communicates data to a receiving device. For example, such a broadcast system may be a cellular network employing a base station. The structure and the operation of the encoding device 101 will be further described with reference to FIGS. 2 and 3. The transmitter 102 may be any one of, but not limited to, a base station of a cellular network, a transmitter in a device communicating with a base station, etc. The device may be any one of, but not limited to, a cellular telephone, a laptop computer, a tablet computer, etc. The communication channel 103 may be a wired or a wireless communication channel between the transmitter 102 and the receiving device 104. Similar to the transmitter 102, the receiving device 104 may be any one of, but not limited to, a base station of a cellular network, a receiver in a device communicating with a base station, etc. The device may be any one of, but not limited to, a cellular telephone, a laptop computer, a tablet computer, etc.

Figure 2:
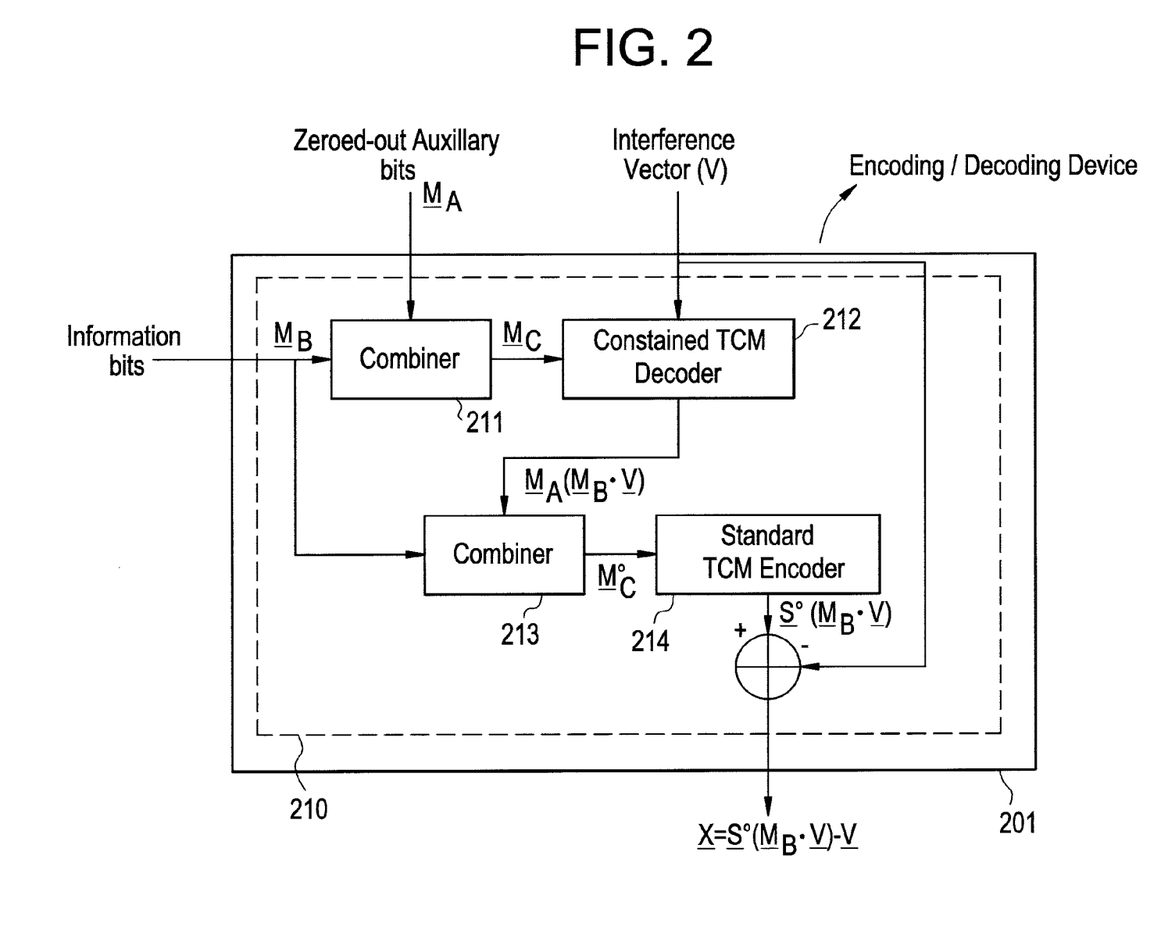
FIG. 2 depicts an encoding device for implementing a process for reducing interference signal effect, according to an example embodiment.
Figure 3:
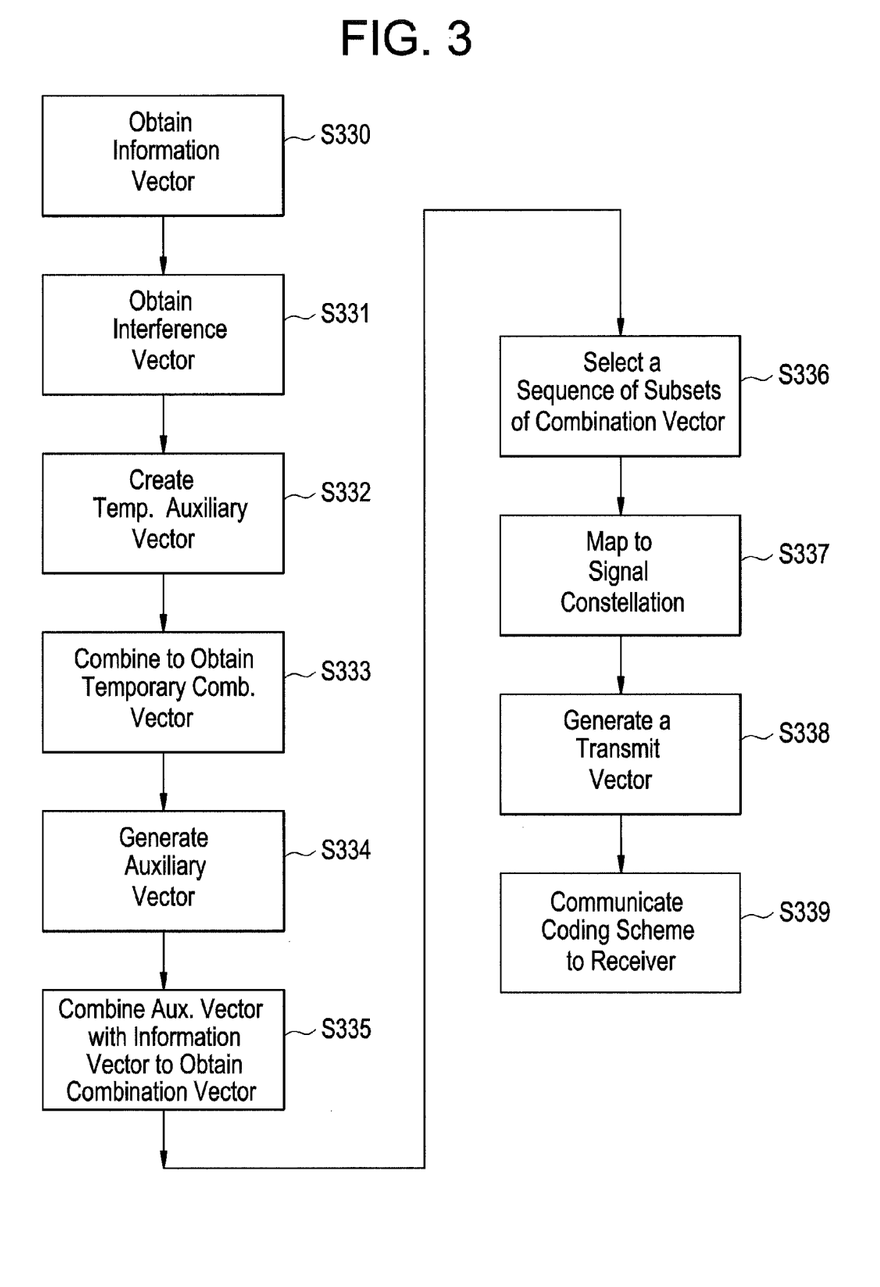
FIG. 3 describes a method for reducing interference signal effect, according to an example embodiment.

FIG. 2 depicts an encoding device for implementing a process for reducing interference signal effect, according to an example embodiment. The encoding device 201 includes a processor 210, which may be programmed to incorporate a variety of modules including, but not limited to, combiners, encoders and decoders. The processor 210, by executing the modules, may carry out a variety of underlying tasks including but not limited to the process described in FIG. 3. Hereinafter, the functionalities of the encoding device 201 and the modules incorporated therein will be described with respect to the process illustrated in FIG. 3. FIG. 3 describes a method for reducing interference signal effect, according to an example embodiment.

A vector of information bits representing data to be transmitted over the communication channel 103, may be designated as $m_B$ and inputted into the encoding device 201. The processor 210 obtains the vector $m_B$ of length $Lb_B$ (S330), where L is a number of symbols (equal to a number of channel uses) to be used in transmitting $Lb_B$ information bits such that $b_B$ information bits are transmitted per channel use (e.g., L=200, $b_B$=1). The processor 210 obtains an interference vector v representing the interference signal of length L (S331). The processor 210 may obtain the interference vector v from an interference source (e.g., another base station). The processor 210 further creates a temporary auxiliary vector $m_A$ of length $Lb_A$ (S332), where L is a number of symbols to be used in transmitting the $Lb_B$ information bits (e.g., L=200), and $b_A$ is the number of auxiliary bits to be used per channel use (e.g., $b_A$=2). The entries of the temporary auxiliary vector are zeros to begin with.

The processor 210, via a combiner 211, combines the information vector $m_B$ and temporary auxiliary vector $m_A$ (S333) to obtain a temporary combination vector. The resulting temporary combination vector may be designated as $m_C$. For example, the temporary combination vector $m_C$ may be obtained by interleaving the entries of the information vector and the temporary auxiliary vector. For example, assuming that the length of the temporary auxiliary vector is twice the length of the information vector, then the combination vector may include a proportional number of bits from both the information vector and the auxiliary vector. In this example, there will be 2 auxiliary bits from the auxiliary vector for every bit from the information vector. To better illustrate this concatenation, assume that the information vector is represented by:

$$m_B=[b_1 b_2 b_3 \ldots b_L]$$

and $$m_A=[a_{11} a_{12} a_{21} a_{22} \ldots a_{L1} a_{L2}],$$

then $$m_C = [c_1 c_2 \ldots c_L], \text{ where } c_1 = [c_{11} c_{12} c_{13}] = [a_{11} a_{12} b_1],$$
etc.

with each $c_j$ for $j=1, 2, 3 \ldots$, referred to as $c_j$ triplet. Therefore, in this example, the first two entries of each triplet are the corresponding entries from the temporary auxiliary vector $m_A$ and the third entry of each triplet is the corresponding entry from the information vector $m_B$.

Thereafter, the processor 210, via a decoder 212, at every instant of time reads in an entry (e.g., a triplet) of the temporary combination vector $m_C$ and a corresponding value of the interference vector v. For example, for $j=1, 2, 3, \ldots$, the processor 210 reads in the $j^{th}$ triplet of the temporary combination vector $m_C$ and the $j^{th}$ value of the interference vector v. The decoder 212 may be a constrained Viterbi decoder operating based on a Trellis Coded Modulation (TCM) algorithm. That is, since the bits corresponding to the information vector inputted into the constrained decoder are known, the constrained decoder 212 may be a special case of TCM decoder. The objective of the constrained decoder is to generate an auxiliary vector $m^o{}_A(m_B, v)$, at S334 of FIG. 3, as will be described below, the values of which may be assigned to the entries of the temporary combination vector, $m_C$, corresponding to the entries of the temporary auxiliary vector $m_A$. The auxiliary vector $m^o{}_A(m_B, v)$ produced by the constrained decoder 212 is such that when the auxiliary vector is combined with the information vector $m_B$, via a combiner 213, to obtain a combination vector $m^o{}_C$, and the combination vector $m^o{}_C$ is then mapped to a sequence of signal points, via an encoder 214, the resulting code vector, $s^o(m_B, v)$, is the closest representation of the interference vector v, compared to any code vector that may be obtained by combining the information vector $m_B$ with any possible auxiliary vector that the processor 210 may determine from the decoder 212. Hereinafter, the process for determining the code vector representing data based on the information vector and the interference vector is described.

Figure 4:
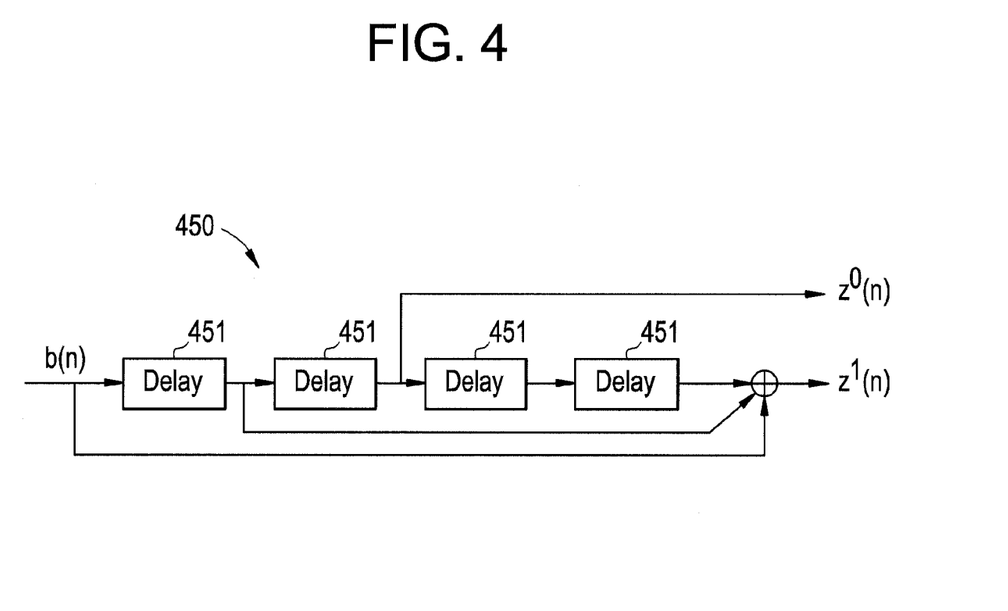
FIG. 4 illustrates a convolutional encoder having states represented by 4 bits, according to an example embodiment.

FIG. 4 illustrates a convolutional encoder having states represented by 4 bits, according to an example embodiment. The encoder module 214 may have incorporated therein a shift register 450. A shift register, such as the shift register 450, may constitute a state of the encoder 214. The encoder 214 may be a standard TCM encoder. As depicted in FIG. 4, the shift register 450 may include 4 delay components 451, thus resulting in an encoder with 4-bit states. However, a person having ordinary skill in the art may easily use shift registers with lower or higher number of bit states without departing from the scope of example embodiments described herein.

As shown in FIG. 4, the shift register 450 determines the two output bits: $z^0(n)$ and $z^1(n)$ based on each incoming input bit b(n) in combination with the state of the encoder 214 (e.g. the contents of the shift register 450). The input bit b(n) may be an entry (bit) of the combination vector $m^o{}_C$. In one example embodiment, a subset of the entries of the combination vector corresponding to the determined auxiliary vector are inputted as b(n).

Figure 5:
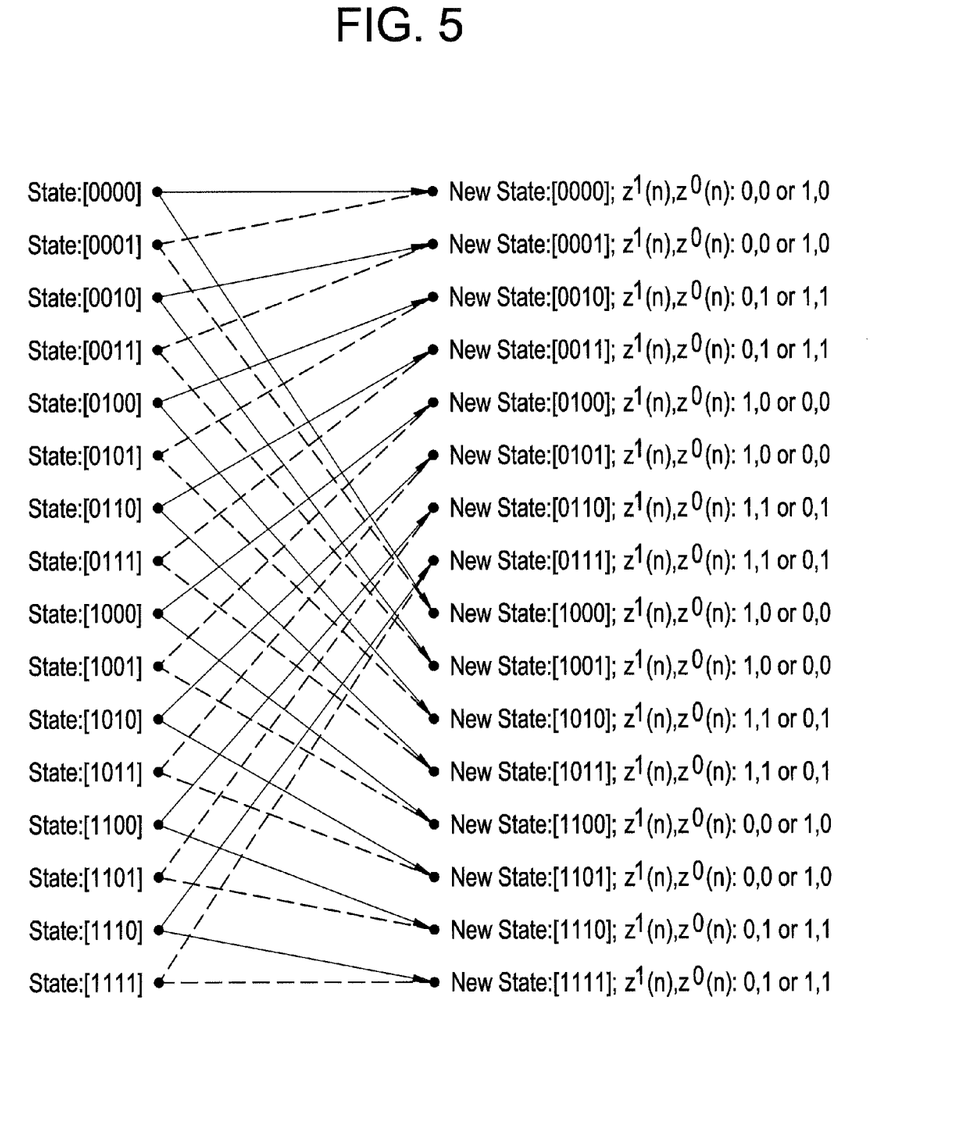
FIG. 5 illustrates a state transition diagram used in determining the code vector, according to an example embodiment.

FIG. 5 illustrates a state transition diagram used in determining the code vector, according to an example embodiment. As shown in FIG. 5, there are two possible transitions out of each state—one associated with the arriving input bit being 0, the other associated with the information bit being 1. Similarly, there are two possible transitions into each state. Whenever a state transition occurs (due to the arrival of the input bit b(n)), two output bits—$z^1(n)$ and $z^0(n)$—are produced. Since there are two transitions into each state, there are two possibilities for the values taken on by the output bits when a transition into a state occurs. FIG. 5 also illustrates next to each state the two possible values associated with the output bit pair that is produced when a transition into that state occurs. The first pair of values is associated with the transition that is shown with a solid line whereas the second pair of values is associated with the transition shown with a dashed line. Thus, for example, when a transition occurs from state [0010] into state [1001], the output bits $z^1(n)$ and $z^0(n)$ take on the value (1,0) whereas when a transition occurs from state [0011] into state [1001], the output bits take on the value (0,0). The two pairs of values associated with transitions into each state differ from each other in the value associated with the bit $z^1(n)$ whereas the bit $z^0(n)$ is identical in both pairs.

When a convolutional code, such as the one being described here, is used for trellis coded modulation, the output bits that are produced during each state transition of the encoder 214 are mapped into a subset of an original signal constellation. A signal constellation and its associated subsets will be further described below with respect to FIG. 6. The signal constellation may be associated with any one of, but not limited to, a Pulse Amplitude Modulation (PAM) system, a Quadrature Amplitude Modulation (QAM) system, etc.

Figure 6:
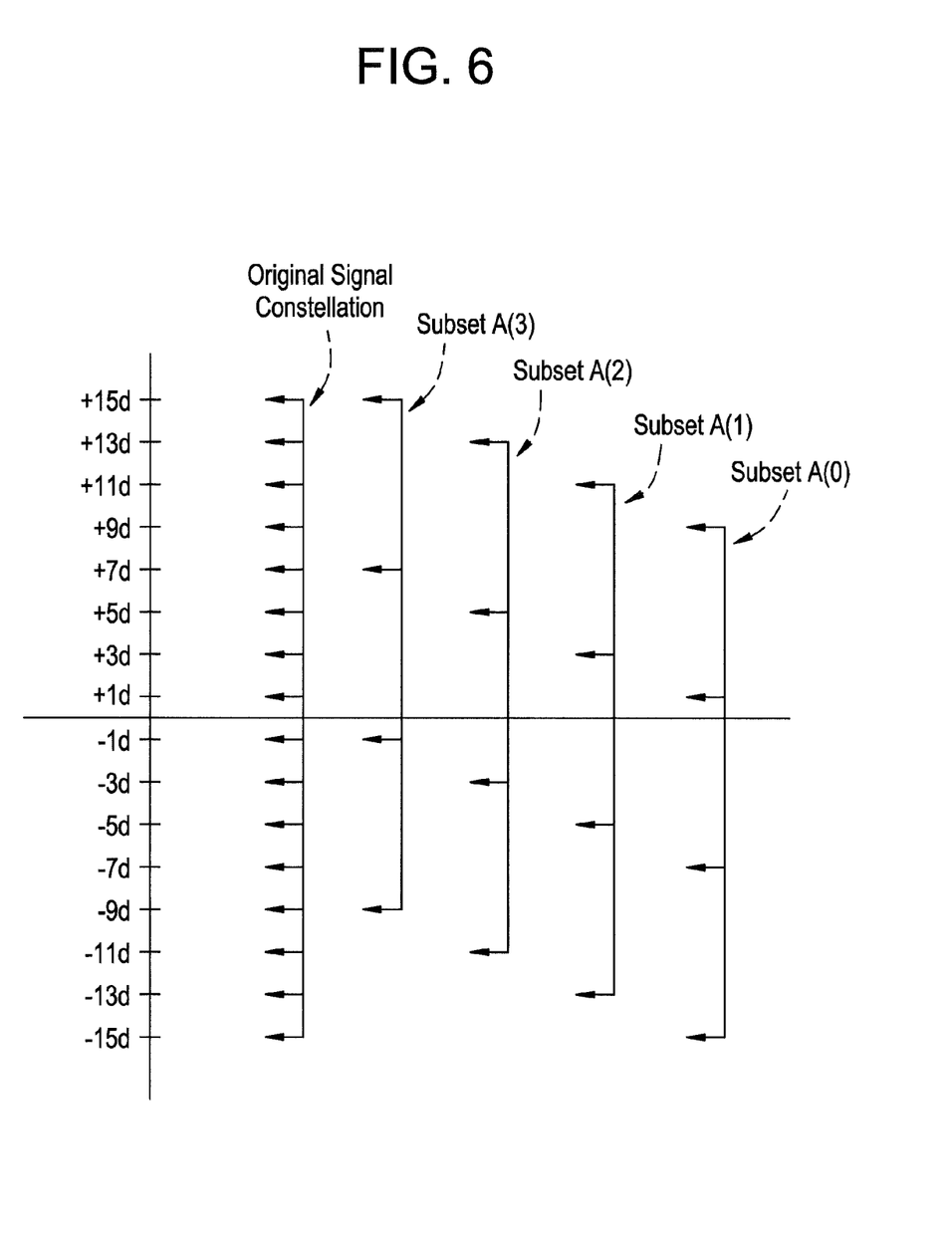
FIG. 6 depicts a signal constellation according to an example embodiment.

Therefore, assuming that, in an example embodiment, a 16 level Pulse Amplitude Modulation (PAM-16) signal constellation is being used as the original signal constellation and that it has been partitioned into four subsets A(0), A(1), A(2) and A(3) as shown in FIG. 6, whenever a pair of output bits ($z^1(n)$ and $z^0(n)$) is produced by the encoder 214, the output bits are mapped into a one of the four subsets of the original signal constellation based on the value of the output bits. Thus, if ($z^1(n), z^0(n)$) equals (0,0), the subset A(0) is selected, if ($z^1(n), z^0(n)$) equals (0,1), the subset A(1) is selected, if ($z^1(n), z^0(n)$) equals (1,0), the subset A(2) is selected and if ($z^1(n), z^0(n)$) equals (1,1), the subset A(3) is selected. Thus, the output bits associated with each state transition, as shown in FIG. 6, can be looked upon as selecting a subset of the original signal constellation. The original signal constellation is constructed in such a manner as to yield an average symbol energy equal to the sum of the desired per-symbol transmit energy and the per-symbol interference energy (determined from the transmitter's viewpoint) with possibly some additional amplification for practical reasons.

Hereinafter, a process of generating the auxiliary vector, at S334, is described. The processor 210, using the constrained decoder 212, generates the auxiliary vector by decoding the triplets of the combination vector $m_C$, using the corresponding entries of the interference vector (e.g., $v_j$) (S334). The decoder 212 sets up a path metric vector p with as many entries as there are encoder states in the associated convolutional code. Thus, in the present example, the path metric vector p has 16 entries. These entries are zeros out to begin with. The decoder 212 also sets up a two dimensional array with as many rows as there are encoder states (16 states in the present example because the 4-bits can be represented in 16 different combinations, each combination representing a state of the encoder) and S columns, where S is the number of decoding steps. Assuming that the encoding scheme is based on a convolutional code operating in a tail-biting mode, a value for S, which based on empirical studies, may be between 1.5 L and 2 L. The $(i,j)^{th}$ entry of the array ζ (e.g. the entry ζ(i,j)) is used to store the previous state on the shortest path to state "i" in the $j^{th}$ step.

The constrained decoder 212 also sets up a 3-dimensional array v, whose first dimension corresponds to the encoder state, the second to the decoding step and the third to the unknown uncoded input bits per decoding step. In this example embodiment, the first bit in the triplet $c_j$ (namely, the bit $c_{j1}$, which is equal to the auxiliary bit $a_{j1}$) drives the encoder that selects the subset of the original signal constellation to be used during the jth channel use. This bit may be referred to as an auxiliary bit or coded input bit. The other two bits, namely $c_{j2}$ and $c_{j3}$, are referred to as uncoded input bits or, simply, uncoded bits. Of these, $c_{j2}$ equals the auxiliary bit $a_{j2}$, which is unknown at this stage whereas the bit $c_{j3}$ equals the information bit $b_j$, which is known. Therefore, in this example embodiment, v would be a 16×S×1 array, where 1 signifies the single unknown auxiliary bit aj2. The decoder 212 also sets up a temporary path metric vector $\pi$ with as many entries are there are encoder states (e.g. 16 states) (for explanation purposes, hereinafter for entries of p,$\zeta$, v and $\pi$, the index that corresponds to the encoder state extends from 0 to 15).

After setting up the path metric vector p, the previous state array and the uncoded bit array v in this manner, the constrained decoder 212 reads in the triplets $c_1, c_2, \ldots$ one by one. The constrained decoder 212 also reads in samples of the interference vector v (namely, $v_1, v_2, \ldots$), one by one. Each time after reading in these inputs, the constrained decoder 212 performs the following actions. First, at the step of reading in the $j^{th}$ triplet $c_j$ and the $j^{th}$ interference sample $v_j$, the entries of the vector p contain the values of the a (shortest) path metric for each of the 16 encoder states up to the j−1st processing step. Specifically, p(i), the $i^{th}$ entry of p, contains the shortest path metric for state i up to the j−1st processing step. After reading in the $j^{th}$ triplet and the $j^{th}$ interference sample $v_j$ as part of the $j^{th}$ processing step, for every encoder state i (0≤i≤15 in the present example), the constrained decoder 212 updates the path metric entry $p_i$ and the appropriate entries of the arrays $\zeta$ and v. To that end, the constrained decoder 212 does the following: the decoder 212 first identifies the two states, $s_1(i)$ and $s_2(i)$, from which transitions can occur into state i. (For instance, for i=4, e.g. encoder state=0100 in FIG. 5, the two previous states $s_1(4)$ and $s_2(4)$ are respectively equal to 8 (=1000) and 9 (=1001). A transition into state i=4 from $s_1(4)$=8 produces the output bit pair (1,0), which is mapped into a subset A(2) of an original signal constellation. The original signal constellation and its subsets will be further described with respect to FIG. 6. Similarly, a transition into state i=4 from $s_2(4)$=9 produces the output bit pair (0,0), which is mapped into the subset A(0) of the original signal constellation.)

FIG. 6 depicts a signal constellation according to an example embodiment. In one example embodiment, the signal constellation is associated with at least one of a Pulse Amplitude Modulation (PAM) system and a Quadrature Amplitude Modulation (QAM) system. A 2-dimensional signal constellation would be the QAM system (e.g., QPSK or 16-QAM) whereas a 1-dimensional signal constellation would be the PAM system with equally spaced levels. Different points or levels in a signal constellation may be referred to as signal points. In general, most of these signal constellations in N dimensions can be thought of as subsets of a translate (e.g., a displacement) of an N-dimensional lattice A, which is a regular array in N dimensions. Hereinafter a PAM scheme is used as an example embodiment, while a QAM may also be used in encoding an information signal.

In general, in a TCM-based encoding scheme using a PAM constellation, a PAM constellation with $2^{n+r}$ levels (signal points) is divided into $2^{k+r}$ subsets, each of which corresponds to a different coset. Parameters n, r and k are parameters of a general TCM-based encoding scheme, where n is the number of bits to be transmitted per channel use, r is the parameter that representing coding redundancy and k is the number of bits per channel use that drive the trellis code. Note that each subset has $2^{n-k}$ signal points. For instance, FIG. 6 shows a PAM constellation with 16 levels (corresponding to n+r=4) divided into 4 subsets (e.g. k+r=2), each with 4 signal points (corresponding to n−k=2), where n=3, r=1 and k=1. In one example embodiment, as depicted in FIG. 6, a 16 level PAM is used with 4 equally spaced subsets used for encoding bits of the combination vector $m^o{}_C$. In the present example embodiment, the 16-level PAM constellation is referred to as the original signal constellation.

Referring back to the process of the constrained decoder 212, recall that the two uncoded bits in the triplet $c_j$, one (the bit $c_{j3}$) corresponds to the information bit $b_j$ which is known whereas the other bit, $c_{j2}$, corresponds to an auxiliary bit $a_{j2}$, which is unknown. For the subset A(m) (m=0, 1, 2, or 3), let $1_m(0,0), 1_m(0,1), 1_m(1,1)$ and $1_m(1,0)$ denote the signal points associated with the subset A(m). These signal points correspond to the values associated with the uncoded information bits within the triplet being processed. Thus, when $c_{j2}$=0 and $c_{j3}$=0, the corresponding signal point is $1_m(0,0)$; when $c_{j2}$=0 and $c_{j3}$=1, the corresponding signal point is $1_m(0,1)$, and so on. Since the uncoded bit $c_{j3}$ (corresponding to the information bit $b_j$) is known, only two of these four signal points are relevant. For instance, if $c_{j3}$=$b_j$=1, only the signal points $1_m(0,1)$ and $1_m(1,1)$ are relevant.

Now, in order to find the path metric for state i at the end of step j, the constrained decoder 212 considers all possible uncoded bit values that can accompany the transitions into state i from the two states $s_1(i)$ and $s_2(i)$. These transitions determine the subset of the signal constellation to be used during that step and the uncoded bit values determine the particular signal point to be used. If the signal point (PAM level) associated with a particular combination of uncoded bits is $\lambda$, then the corresponding value of the branch metric is $(v_j-\lambda)^2$. The constrained decoder 212 uses this knowledge to identify the best (shortest) branch metric for each of the possible one-step transitions into state i. Let the shortest branch metric for the transition from state $s_1(i)$ into state i (during the jth step) be $\beta_1(i)$ and that associated with the transition from state $s_2(i)$ into state i be $\beta_2(i)$. Then, the shortest path metric for state i at the end of step j is the minimum of the two possible path metrics $p(s_1(i))+\beta_1(i)$ and $p(s_2(i))+\beta_2(i)$. The constrained decoder 212 stores this minimum in the temporary variable $\pi(i)$, which is the $i^{th}$ entry of the vector n.

In one example embodiment, the process of finding the path metric for state i at the end of step j may be as follows. First, consider the possible transitions into state i=4 (e.g. equal to 0100) as part of the processing associated with step j. As described before, a (one-step) transition can occur into state i=4 either from state $s_1(4)$=8 or $s_2(4)$=9. The signal constellation subsets associated with these transitions are A(2) and A(0), respectively. Assume, for this example, that the known uncoded bit cj3 (corresponding to the information vector entry $b_j$) equals 1. Then, the relevant signal points within the subset A(2) are $1_2(0,1)$ and $1_2(1,1)$, the former corresponding to the other uncoded bit $(c_{j2})$ having the value 0 and the latter corresponding to $c_{j2}$ having the value 1. Similarly, the relevant signal points within the subset A(0) are $1_0(0,1)$ and $1_0(1,1)$. Therefore, for each of the possible previous states $s_1(4)$=8 and $s_2(4)$=9, the constrained decoder 212 computes two branch metrics as follows: Since the two relevant signal points for the possible previous state $s_1(4)$ are $1_2(0,1)$ and $1_2(1,1)$, the two possible branch metrics are $(v_j-1_2(0,1))^2$ and $v_j-1)(1,1))^2$ where $v_j$ denotes the value of the interfering signal at the $j^{th}$ symbol. The smaller of these two metrics is treated as the branch metric $\beta_1(4)$ associated with the transition from the state $s_1(4)$ into state i=4. $\beta_2(4)$, the branch metric associated with the transition from state $s_2(4)$ into state i=4, is computed in a similar manner. Once the branch metrics associated with the two possible transitions into state i=4 in the $j^{th}$ step are determined, the smaller of the two sums $p(s_1(4))+\beta_1(4)$ and $p(s_2(4))+\beta_2(4)$ is treated at the path metric for state i=4 at step j. It is temporarily stored in the variable $\pi(4)$.

Second, when the path metric for a state is computed and stored in a temporary variable as described above, the constrained decoder 212 also selects for that state the best previous state and stores it in the appropriate entry of the array $\zeta$. Also, it determines the values of the unknown uncoded bits within the current triplet $c_j$ that yielded the best path metric and stores them in the appropriate entries of the array v. Thus, referring to the example described in the above paragraph, after computing the path metric for state i=4, if the sum $p(s_1(4))+\beta_1(4)$ happens to be smaller than the sum $p(s_2(4))+\beta_2(4)$, the state $s_1(4)$ is identified as the best previous state for the state i=4 on the $j^{th}$ step and the entry $\zeta(i,j)$ is set equal to $s_1(4)$. Also, in this case, since $\beta_1(4)$ figured in the path metric that ultimately got associated with the state i=4, the value of the unknown uncoded bit $c_{j2}$ that was responsible for the signal point that yielded the branch metric $\beta_1(4)$ is stored in the entry v(i,j,1). In this example embodiment, the last index is 1 since there is exactly 1 unknown uncoded bit at each step.

Third, in this manner, for each encoder state i the path metric values are computed and stored in the temporary vector $\pi$. Similarly, for each state i, the best previous state is determined and stored in the entry $\zeta(i,j)$ and the best values of the unknown uncoded bits are determined and stored in the appropriate entries of the array v. At the end of step j, the temporary vector it is copied into the path metric vector p so that it can be reused for the next step (e.g., j+1).

Referring back to the example embodiment according to which the constrained decoder 212 carries out the decoding process, it can be seen that the constrained decoder 212 carries out L steps, updating the path metric vector p and filling the arrays $\zeta$ and v. Thereafter, the constrained decoder 212 performs S-L additional steps, cyclically repeating entries of the input vector $m_C$ and the interference vector v as if they represented additional inputs. Thus, on the L+1 step, the triplet $c_1$ is used as if $c_1$ represents the information bit segment corresponding to the L+$1^{st}$ step; on the L+$2^{nd}$ step, $c_2$ is used as if $c_2$ represents the information bit segment corresponding to the L+$2^{nd}$ step; and so on. The operations performed on each of these additional steps are identical to those that were performed during each of the first L steps, as described above. At the end of S steps, the constrained decoder 212 finds the smallest entry in the path metric vector p and the corresponding index $i_{min}(S)$. In other words, at the end of the $S^{th}$ step, the path metric associated with the state $i_{min}(S)$ is shorter than or equal to the path metric to any other state.

Next, the constrained decoder 212 traces back the state sequence on the shortest path by looking up the appropriate entries of best previous state array $\zeta$. Thus, for instance, by looking up the entry $\zeta(i_{min}(S),S)$, the decoder determines the entry $i_{min}(S-1)$ which is the second to last state on the state sequence corresponding to the shortest path; then by looking up the entry $\zeta(i_{min}(S-1),S-1)$, the constrained decoder 212 determines the state on the shortest path that corresponds to step S-2, and so on. While tracing back the state sequence, when the constrained decoder reaches the state corresponding to step L, along with looking up the appropriate entries on the previous state array $\zeta$, the constrained decoder 212 also begins to collect the corresponding entries in the array v, since these entries represent the values of the uncoded auxiliary bits that contributed to the shortest path metric. The constrained decoder 212 also collects the values of the coded auxiliary bits that are associated with the state transitions on the (shortest) path being traced back, as will be described below.

The first bit in the binary representation of a state equals the value a (coded) input bit must have in order to cause a (one-step) transition to that state. (This is true in this example embodiment, where a single input bit drives the state transitions on each step of the convolutional code. In general, if m such bits are associated with each step of the convolutional code, the first m bits in the binary representation of a state equal the values the m input bits must have to cause a one-step transition to that state). Thus, by looking up the binary representation of each state on the path being traced back, the constrained decoder 212 can identify the values of the corresponding coded input bits $(c_{j1})$ (Recall that the bit $c_{j1}$ is the auxiliary bit $a_{j1}$.). Thus, when the trace-back is completed, the constrained decoder 212 has the values of the coded input bits, $c_{j1}$, for $1 \leq j \leq L$. The decoder also has, for $1 \leq j \leq L$, values of the uncoded bits $c_{j2}$ (which were collected during the trace-back by looking up the appropriate entries of the array v). Besides, the constrained decoder 212 already has the values of the uncoded bits $c_{j3}$, which correspond to the information bits $b_j$. Thus, at this point the processor 210 for trellis-coded-modulation-based dirty paper coding (which includes the constrained decoder 212 such as the constrained Viterbi decoder) has the values of the auxiliary information bits $m°_A(m_B,v)$ (besides the already known information bits $m_B$).

At 5335, the processor 210 combines the auxiliary vector $m°_A(m_B,v)$ with the information vector $m_B$ to obtain the combination vector $m°_C$. The processor 212 carries out the combining by assigning values of the generated auxiliary vector to entries of the temporary combination vector that correspond to the temporary auxiliary vector. The entries of the temporary combination vector $m_C$, which, as recited above, are zeros. The assigning of values to entries of the temporary combination vector that correspond to the temporary auxiliary vector is carried out to minimize a distance between the code vector and the interference vector compared to distances between all possible code vectors associated with the information vector and the interference vector.

The processor 210, at S336, selects a sequence of subsets of a signal constellation using a subset of the entries of the combination vector. In one example embodiment, the subset of the entries of the combination vector used for selecting a sequence of subsets of the signal constellation correspond to the bits $c_{j1}$, for $1 \leq j \leq L$. These bits drive a convolutional (Trellis) encoder, producing a sequence of output bit pairs as described above. Each bit pair is mapped into a subset of the signal constellation to be used during that channel use. In one example embodiment, the processor 210 selects the sequence of subsets of the signal constellation according to a TCM scheme, as described above. In yet another example embodiment, the processor 210 selects the sequence of subsets of the signal constellation using a constrained TCM decoder, as described above.

Thereafter, the processor, at S337, maps the remaining entries of the combination vector to signal points within the selected subsets of the signal constellation, as described above. The process of generating the sequence of subsets of the signal constellation and mapping uncoded bits to signal points within the selected subsets is carried out by an encoder 214. In case a trellis coded modulation scheme (.e.g. similar to the one described in this example) is used, the encoder 214 may be a standard TCM encoder. The mapping process may be carried out according to on a known Gray Coding algorithm. The output of the encoder 214 is a code vector $s^o(m_B, v)$, which is a sequence of L signal points (e.g., PAM levels).

Thereafter, at S338, the processor 212 generates a transmit vector for transmission over the communication channel 103, based on the code vector and the interference vector. The transmit vector may be represented by x. The transmit vector x may be generated by subtracting the known interference vector from the code vector $s^o(m_B,v)$. Therefore, x may be represented by $x=s^o(m_B,v)-v$. The transmit vector may then be communicated over the communication channel 103 to the receiving device 104 via the transmitter 102. Finally, the processor 210 may communicate the schemes according to which the processor carries out the encoding process, as described above, to the receiving device (S339). The processor 210 may transmit the encoding schemes to the receiving device via a separate control channel. Furthermore, the transmission may be before carried out prior to the actual transmission of the transmit vector over the communication channel 103.

Figure 7:
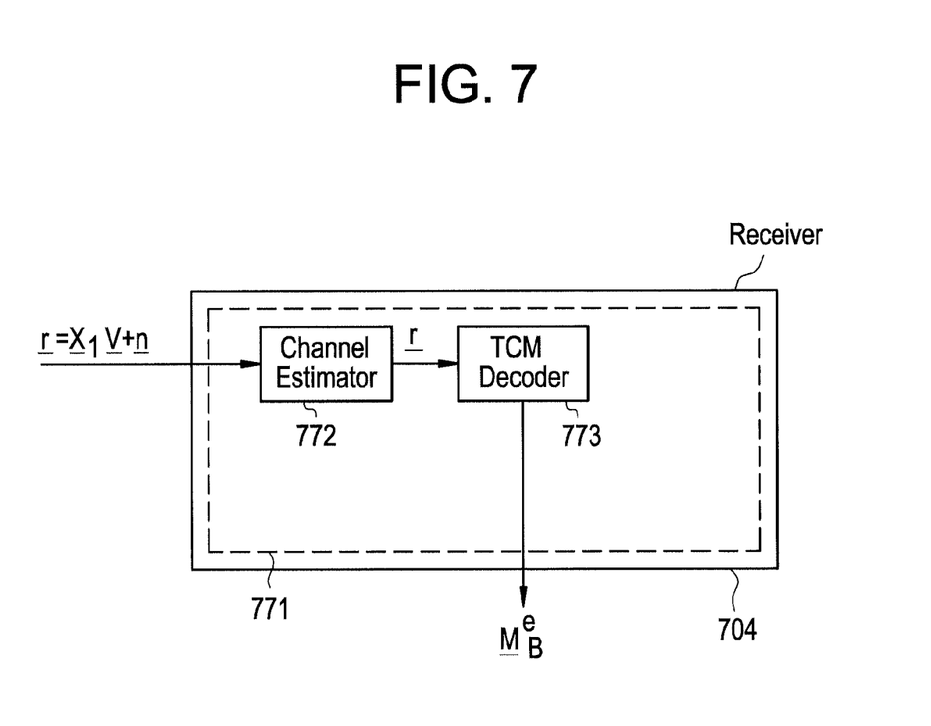
FIG. 7 depicts a receiving device for receiving a signal communicated over a communication channel, according to an example embodiment.

FIG. 7 depicts a receiving device for receiving a signal communicated over a communication channel, according to an example embodiment. The receiving device 704 includes a processor 771, which may be programmed to incorporate a variety of modules, including but not limited to, a channel estimator 772 and a decoder 773 for carrying out underlying tasks including but not limited to the process described in FIG. 8. Hereinafter, the functionalities of the receiving device 704 and the modules incorporated therein will be described with respect to the process illustrated in FIG. 8.

Figure 8:
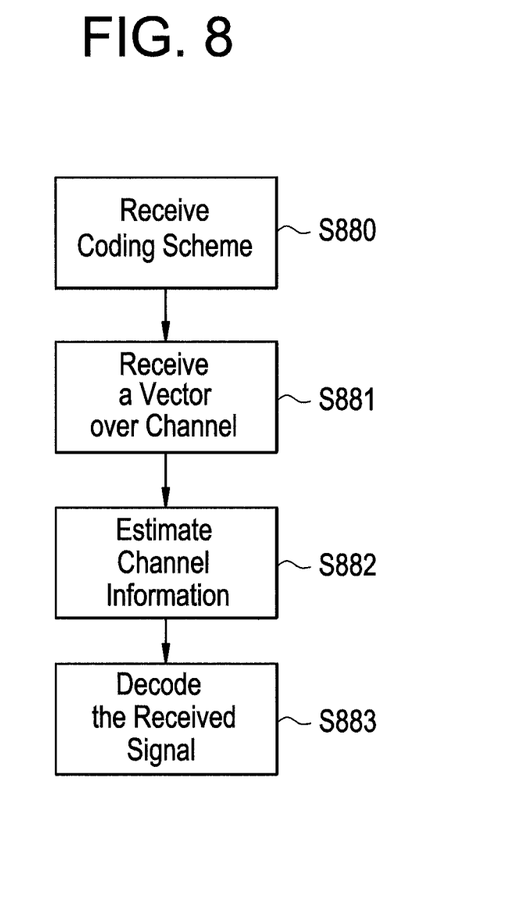
FIG. 8 describes a method for estimating an information vector transmitted over a communication channel, at a receiving device, according to an example embodiment.

FIG. 8 describes a method for estimating an information vector transmitted over a communication channel, at a receiving device, according to an example embodiment. At S880, the processor 771 receives the coding scheme used by the encoding/decoding device 201 via a separate control channel. As described above, the decoder is aware of the coding scheme including the number of signal levels used in the construction of transmit vector. Such coding scheme may be communicated to the receiving device by the processor 210 of the encoding device 201.

At S881, the receiving device 704 receives a signal transmitted to the receiving device 704 over the communication channel 103. The received signal may be represented as r, where r is:

$r=x+v+n=s^o(_B,v)-v+v+n=s^o(m_B,v)+n$, where n represented an additive white Gaussian noise vector corresponding to channel noise.

At S882, the processor 771, via the channel estimator 772, estimates the channel information. Estimating channel information may describe how a signal propagates from the transmitter to the receiver and represents the combined effect of, for example, scattering, fading, and power decay with distance. The channel information may be estimated using any known method. As described above, the decoder is aware of the coding scheme including the number of PAM levels used in the construction of the code vector and the distance between successive PAM levels.

In one example embodiment, the processor 771 determines a combination of the information vector $m_B$ and auxiliary vector MA such that the corresponding code vector is closest to the received vector, denoted by $r=s^o(m_B,v)+n$, where $s^o(m_B,v)$ represents the code vector. Since the received vector is the code vector obtained by carrying out trellis coded modulation on the combination vector plus an additive white Gaussian noise vector n, the processor 771 uses a standard Trellis Coded Modulation (TCM) decoder may to decode the received signal (S883) and find estimates of the desired information bit vectors, $m^e_B$. The standard TCM decoder works off the same convolution code and signal constellation, including the same subsets, as used by processor 212 of the encoding/decoding device 201. Note that that there are no constraints on the (standard) TCM decoder employed by the receiver since the entries of the information vector as well as the entries of the auxiliary vector, at the encoding device 201 are unknown to the receiving device 704. The operation of a standard TCM decoder, employing a Viterbi decoder, is known in the art and thus omitted here for brevity.

Variations of the example embodiments are not to be regarded as a departure from the spirit and scope of the example embodiments, and all such variations as would be apparent to one skilled in the art are intended to be included within the scope of this disclosure.

What is claimed:

1. A method for reducing an effect of an interference signal on data being transmitted over a communication channel, comprising:
   determining, by a processor, a first vector based on an information vector, the information vector representing the data;
   determining, by the processor, a second vector based on the first vector and an interference vector, the interference vector representing the inference signal;
   determining, by the processor, a combination vector based on the second vector and the information vector;
   determining, by the processor, a code vector representing the data by mapping entries of the combination vector to selected subsets of a signal constellation; and
   generating, by the processor, a transmit vector for transmitting the data based on the code vector and the interference vector.

2. The method of claim 1, wherein
   the determining the first vector includes,
      generating an auxiliary vector; and
      combining the auxiliary vector with the information vector to obtain the first vector, and
   the determining the code vector includes,
      selecting a sequence of subsets of the signal constellation using a subset of entries of the combination vector; and
      mapping the remaining entries of the combination vector to signal points within the selected subsets of the signal constellation.

3. The method of claim 2, wherein the combining the auxiliary vector with the information vector comprises:
   assigning values of the generated auxiliary vector to entries of a temporary combination vector that correspond to a temporary auxiliary vector, the temporary combination vector including values corresponding to the information vector and the temporary auxiliary vector.

4. The method of claim 3, wherein the assigning values to the entries of the temporary combination vector that correspond to the temporary auxiliary vector is carried out to minimize a distance between the code vector and the interference vector compared to distances between all possible code vectors associated with the information vector and the interference vector.

5. The method of claim 2, wherein the mapping is carried out according to Gray Coding.

6. The method of claim 2, wherein the selecting a sequence of subsets of a signal constellation selects the sequence according to a Trellis Coded Modulation (TCM) scheme.

7. The method of claim 6, wherein the selecting a sequence of subsets of a signal constellation uses a constrained Trellis Coded Modulation (TCM) decoder.

8. The method of claim 2, wherein the signal constellation is associated with at least one of a Pulse Amplitude Modulation (PAM) system and a Quadrature Amplitude Modulation (QAM) system.

9. The method of claim 1, wherein the generating the transmit vector comprises:
subtracting the interference vector from the code vector.

10. The method of claim 1, further comprising:
communicating to a receiving device, a scheme according to which the code vector is determined, the scheme enabling the receiving device to estimate the information vector, wherein
the scheme is communicated over a separate control channel, the control channel being different than the communication channel.

11. An encoding device comprising a processor for reducing an effect of an interference signal on data transmitted over a communication channel, the processor configured to,
determine a first vector based on an information vector, the information vector representing the data;
determine a second vector based on the first vector and an interference vector, the interference vector representing the inference signal;
determine a combination vector based on the second vector and the information vector;
determine a code vector representing the data by mapping entries of the combination vector to selected subsets of a signal constellation; and
generate a transmit vector for transmitting the data based on the code vector and the interference vector.

12. The encoding device of claim 11, wherein the processor is further configured to,
determine the first vector by,
generating an auxiliary vector;
combining the auxiliary vector with the information vector to obtain the first vector, and
determine the code vector by,
selecting a sequence of subsets of the signal constellation using a subset of entries of the combination vector; and
mapping the remaining entries of the combination vector to signal points within the selected subsets of the signal constellation.

13. The encoding device of claim 12, wherein the processor is further configured to combine the auxiliary vector with the information vector by,
assigning values of the generated auxiliary vector to entries of a temporary combination vector that correspond to a temporary auxiliary vector, the temporary combination vector including values corresponding to the information vector and the temporary auxiliary vector.

14. The encoding device of claim 13, wherein the processor assigns values to entries of the temporary combination vector that correspond to the temporary auxiliary vector so as to minimize the distance between the code vector and the interference vector compared to distances between all possible code vectors associated with the information vector and the interference vector.

15. The encoding and decoding device of claim 12, wherein the processor is further configured to perform the mapping according to Gray Coding.

16. The encoding device of claim 12, wherein the processor is further configured to select the sequence of subsets of the signal constellation according to a Trellis Coded Modulation (TCM) scheme.

17. The encoding device of claim 16, wherein the processor is further configured to select the sequence of subsets of the signal constellation using a constrained Trellis Coded Modulation (TCM) decoder.

18. The encoding device of claim 12, wherein the signal constellation is associated with at least one of a Pulse Amplitude Modulation (PAM) system and a Quadrature Amplitude Modulation (QAM) system.

19. The encoding device of claim 11, wherein the processor is further configured to generate the transmit signal by,
subtracting the interference vector from the code vector.

20. The encoding device of claim 11, wherein the processor is further configured to,
communicate to a receiving device a scheme according to which the code vector is determined, the scheme enabling the receiving device to estimate the information vector, wherein
the scheme is communicated over a separate control channel, the control channel being different than the communication channel.

* * * * *